United States Patent
Treu et al.

(10) Patent No.: US 8,525,254 B2
(45) Date of Patent: Sep. 3, 2013

(54) SILICONE CARBIDE TRENCH SEMICONDUCTOR DEVICE

(75) Inventors: Michael Treu, Villach (AT); Ralf Siemieniec, Villach (AT)

(73) Assignee: Infineon Technologies Austria AG, Villach (AU)

(*) Notice: Subject to any disclaimer, the term of this patent is extended or adjusted under 35 U.S.C. 154(b) by 136 days.

(21) Appl. No.: 12/854,974

(22) Filed: Aug. 12, 2010

(65) Prior Publication Data

US 2012/0037920 A1  Feb. 16, 2012

(51) Int. Cl.
*H01L 29/24* (2006.01)
*H01L 29/78* (2006.01)

(52) U.S. Cl.
USPC ............ 257/330; 257/335; 257/777; 257/329

(58) Field of Classification Search
USPC .................... 257/77, 330, 335, 329
See application file for complete search history.

(56) References Cited

U.S. PATENT DOCUMENTS

| | | | |
|---|---|---|---|
| 6,630,698 B1 | 10/2003 | Deboy et al. | |
| 6,633,064 B2 | 10/2003 | Auerbach et al. | |
| 7,102,182 B2 | 9/2006 | Takemori et al. | |
| 7,582,922 B2 | 9/2009 | Werner | |
| 7,700,971 B2 | 4/2010 | Ueno | |
| 7,989,882 B2 * | 8/2011 | Zhang et al. | 257/330 |
| 2007/0272953 A1 | 11/2007 | Hirler | |
| 2008/0150073 A1 | 6/2008 | Willmeroth et al. | |
| 2008/0197361 A1 * | 8/2008 | Ueno | 257/77 |
| 2009/0261350 A1 * | 10/2009 | Yamamoto et al. | 257/77 |
| 2011/0018005 A1 * | 1/2011 | Nakano | 257/77 |

FOREIGN PATENT DOCUMENTS

| | | |
|---|---|---|
| DE | 198 40 032 C1 | 11/1999 |
| DE | 100 24 480 B4 | 2/2006 |
| DE | 10 2006 025 218 A1 | 12/2007 |
| DE | 102 96 970 B4 | 4/2008 |
| DE | 10 2006 061 994 A1 | 7/2008 |
| DE | 10 2008 057 412 A1 | 6/2009 |
| JP | 2008-177335 A | 7/2008 |
| JP | 2008-186925 A | 8/2008 |

* cited by examiner

*Primary Examiner* — Marcos D. Pizarro
*Assistant Examiner* — Tifney L. Skyles
(74) *Attorney, Agent, or Firm* — Murphy, Bilak & Homiller, PLLC

(57) ABSTRACT

A semiconductor device as described herein includes a silicon carbide semiconductor body. A trench extends into the silicon carbide semiconductor body at a first surface. A gate dielectric and a gate electrode are formed within the trench. A body zone of a first conductivity type adjoins to a sidewall of the trench, the body zone being electrically coupled to a contact via a body contact zone including a higher maximum concentration of dopants than the body zone. An extension zone of the first conductivity type is electrically coupled to the contact via the body zone, wherein a maximum concentration of dopants of the extension zone along a vertical direction perpendicular to the first surface is higher than the maximum concentration of dopants of the body zone along the vertical direction. A distance between the first surface and a bottom side of the extension zone is larger than the distance between the first surface and the bottom side of the trench.

22 Claims, 6 Drawing Sheets

SILICONE CARBIDE TRENCH SEMICONDUCTOR DEVICE

BACKGROUND

Silicon Carbide (SiC) is a semiconductor material with desirable properties for many applications. Desirable properties of SiC include a high maximum electron velocity which means that SiC devices can operate at high frequencies, a high thermal conductivity allowing SiC devices to easily dissipate excess heat, and a high breakdown electric field allowing SiC devices to operate at high voltage levels.

With regard to the high breakdown electric field in SiC, it is challenging to meet the demands on reliability in gate dielectrics of SiC trench semiconductor devices.

A need exists for a trench semiconductor device that is capable to meet those requirements.

For these and other reasons there is a need for the present invention.

SUMMARY

According to an embodiment of a semiconductor device, the device includes a silicon carbide semiconductor body. A trench extends into the silicon carbide semiconductor body at a first surface and a gate dielectric and a gate electrode are formed within the trench. A body zone of a first conductivity type adjoins to a sidewall of the trench, the body zone being electrically coupled to a contact via a body contact zone including a higher maximum concentration of dopants than the body zone. An extension zone of the first conductivity type is electrically coupled to the contact via the body zone, wherein a maximum concentration of dopants of the extension zone along a vertical direction perpendicular to the first surface is higher than the maximum concentration of dopants of the body zone along the vertical direction. A distance between the first surface and a bottom side of the extension zone is larger than the distance between the first surface and the bottom side of the trench According to another embodiment of a semiconductor device, the semiconductor device includes a silicon carbide semiconductor body. A trench extends into the silicon carbide semiconductor body at a first surface. A gate dielectric, a gate electrode and a conductive zone are formed within the trench, the conductive zone being electrically insulated from the gate electrode. A body zone of a first conductivity type adjoins to a bottom side and to a part of a sidewall of the trench, the body zone being electrically coupled to the conductive zone via a bottom side of the trench. A source zone of a second conductivity type adjoins to the bottom side of the trench, the source zone being electrically coupled to the conductive zone via the bottom side of the trench. An extension zone of the first conductivity type is formed at the first surface. The device furthermore includes a drift zone of the second conductivity type wherein a part of the drift zone is arranged between the extension zone and the body zone and adjoins to the sidewall of the trench.

Those skilled in the art will recognize additional features and advantages up on reading the following detailed description, and up on viewing the accompanying drawings.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

Features and advantages of embodiments will be apparent from the following description with reference to the accompanying drawings. The drawings are not necessarily to scale and emphasis is placed upon illustrating the principles. The features of the various illustrated embodiments can be combined in any way unless they exclude each other.

DETAILED DESCRIPTION

Figure 1:
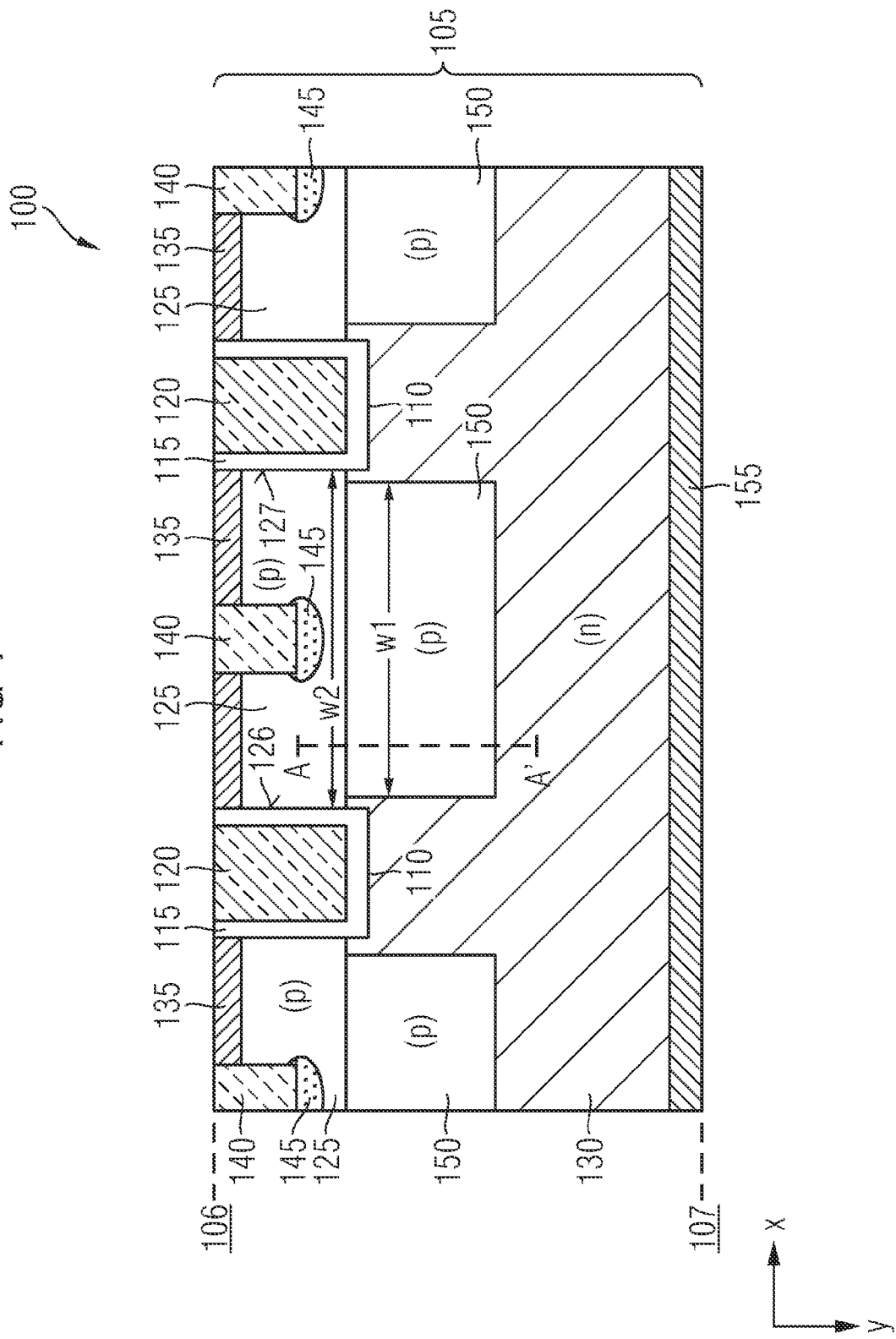
FIG. 1 illustrates a cross-sectional view of a portion of a SiC trench semiconductor device including an extension zone according to an embodiment.

FIG. 1 illustrates a portion of a SiC Trench Metal Oxide Semiconductor Field Effect Transistor (Trench MOSFET) 100. Trench MOSFET 100 includes a SiC semiconductor body 105 having a first surface 106, e.g. at a front side, and a second surface 107, e.g., at a rear side, the second surface 107 being opposed to the first surface 106.

At least one trench 110 extends into the semiconductor body 105 at the first surface 106. A dielectric structure 115 covers a bottom side and sidewalls of the trench 110. A part of the dielectric structure 115 covering the sidewalls of the trench 110 functions as a gate dielectric of the SiC trench MOSFET 100. As an example, the dielectric structure may include thermal $SiO_2$ formed by thermally oxidizing SiC material at the sidewalls of the trench 110.

A gate electrode 120 adjoins to the dielectric structure 115 within the trench 110. The gate electrode 120 may be formed by one or by a combination of conductive materials such as doped semiconductor materials, e.g., doped polysilicon such as p-type polysilicon, and metals or metal alloys such as Ni, Ag or W.

At least one p-type body zone 125 is formed within the semiconductor body 105. The p-type body zone 125 adjoins to opposing sidewalls 126, 127 of neighboring trenches 110. A bottom side of the p-type body zone 125 and the bottom side of the gate electrode 120 are arranged at a same level or close to one another along a vertical direction y perpendicular to the first surface 106. According to other embodiments, the bottom side of the p-type body zone 125 may also be arranged at a vertical level different from the vertical level of the bottom side of the trench 110 provided that the channel current can exit the channel and enter a drift zone as desired, e.g. there is no unacceptable constriction of the current in an entry region of the drift zone when the current exits the channel and enters the entry region of the drift zone.

The p-type body zone 125 may be formed by ion implantation of dopants. As an example, N may be used as an n-type dopant and Al and/or B may be used as a p-type dopant. The p-type body zone 125 may also be formed by in-situ doping during epitaxial growth, e.g., chemical vapor deposition (CVD) epitaxial growth of a part of the SiC semiconductor body 105. In case of CVD epitaxial growth, $N_2$ may be introduced into the deposition chamber of n-type doping and trimethyl- or triethyl-aluminum may be introduced into the deposition chamber for p-type doping. Doping of the p-type body zone 125 may also be achieved by combining in-situ doping and ion implantation, for example.

At the first surface 106, an n-type source zone 135 is formed. Similar to the p-type body zone 125, ion implantation and/or in-situ doping may be used for introducing respective dopants into the semiconductor body 105. The n-type source zone 135 adjoins to opposing sidewalls 126, 127 of trenches 110 along a lateral direction x. The trenches 110 may be arranged as parallel stripes. However, trench geometries including polygons, e.g., octagons, or circular rings are likewise suitable.

The n-type source zone 135 and the p-type body zone 125 are electrically coupled to a contact 140. In the embodiment illustrated in FIG. 1, the contact 140 is a trench contact including a conductive material such as a metal, a metal alloy, a doped semiconductor or a combination thereof, e.g. NiAl, TiAl. According to other embodiments, the contact 140 may differ from a trench contact. As an example, the contact 140 may also be formed as a contact plug or as a contact line being arranged on the n-type source zone 135 and on the p-type body zone 125 at the first surface 106.

As used herein, the term "electrically coupled" is not meant to mean that the elements must be directly coupled together but intervening elements may provided between the "electrically coupled" elements. As an example, the p-type body zone 125 may be electrically coupled to the contact 140 via a p-type contact zone 145 to a bottom portion of the contact 140. The p-type contact zone 145 includes a higher concentration of dopants than the p-type body zone 125 to improve or facilitate an ohmic contact to the contact 140.

A p-type extension zone 150 is arranged below the p-type body zone 125 and is electrically coupled to the contact 140 via the p-type body zone 125 and the p-type contact zone 145. Lateral sides and a bottom side of the p-type extension zone 150 adjoin to an n-type drift zone 130. A top side of the p-type extension 150 adjoins to the p-type body zone 125. In an interface region between the p-type body zone 125 and the p-type extension zone 150, dopants of both the p-type body zone 125 and the p-type extension zone 150 may be present due to overlapping implant profiles of these zones.

A maximum concentration of dopants of the p-type extension zone 150 along the vertical direction y is higher than the maximum concentration of dopants of the p-type body zone 125 along this direction. With regard to this relation, the dopants defining the p-type contact zone 145 are not considered as dopants of the p-type body zone 125.

By forming the p-type extension zone 150 below the p-type body zone 125, a maximum electric field within the dielectric structure 115 may be reduced by an electric field shield via a space charge region between the p-type extension zone 150 and the n-type drift zone 130 in a blocking operation mode. Thus, reliability of the dielectric structure 115, i.e. of the gate dielectric of the trench MOSFET 100, can be improved.

A vertical channel extends along the sidewalls of the trench 110. In an on-state of trench MOSFET 100, current flows from the n-type source zone 135 at the first surface 106 to a drain zone 155 at the second surface 107 of the semiconductor body 105 via the vertical channel and the n-type drift zone 130 along the vertical direction y.

In a vertical channel device as illustrated in FIG. 1, the mobility of carriers along the vertical channel may be higher than the mobility in a lateral channel device because of superior interface properties between the p-type body zone 125 and the dielectric structure 115. This is due to the different crystallographic orientation of the SiC surface onto which the dielectric structure 115 is formed. According to one embodiment of the vertical channel device, the dielectric structure 115 is be formed on a surface of a [1, 1, -2, 0] plane of 4H—SiC. The vertical channel device also allows for small cell pitches, e.g., cell pitches smaller than in a lateral channel device. By electrically coupling the p-type extension zone 150 to the contact 140 via the p-type body zone 145, latch-up immunity can be improved compared to a device layout having a contact to the extension zone only at limited locations such as an end, middle and/or start of a stripe-shaped trench MOSFET.

The vertical channel trench MOSFET 100 illustrated in FIG. 1 is beneficial with regard to the reliability of the gate dielectric and an on-resistance of the device.

According to the embodiment illustrated in FIG. 1, a width $w_1$ of the p-type extension zone 150 along the lateral direction x is smaller than the width $w_2$ of the p-type body zone 125. A lateral distance between the sidewall 126 of the trench 110 and the p-type extension zone 150 may range between 0 μm to 1 μm, in particular between 0 μm to 500 nm or even between 0 μm to 200 nm.

According to another embodiment, a peak of the profile of dopants of the p-type extension zone 150 along the vertical direction y is within a lower half of this zone arranged deeper within the semiconductor body 105 than an upper half of the p-type extension zone 150.

When forming the p-type extension zone 150 by ion implantation, a dose of dopants may range between $10^{13}$ cm$^{-2}$ and $5 \times 10^{14}$ cm$^{-2}$.

According to yet another embodiment, a vertical distance of a bottom side of the p-type extension zone 150 to the bottom side of the trench 110 ranges between 500 nm to 1000 nm and a width of the trench along the lateral direction ranges between 1 μm to 2 μm.

Figure 2:
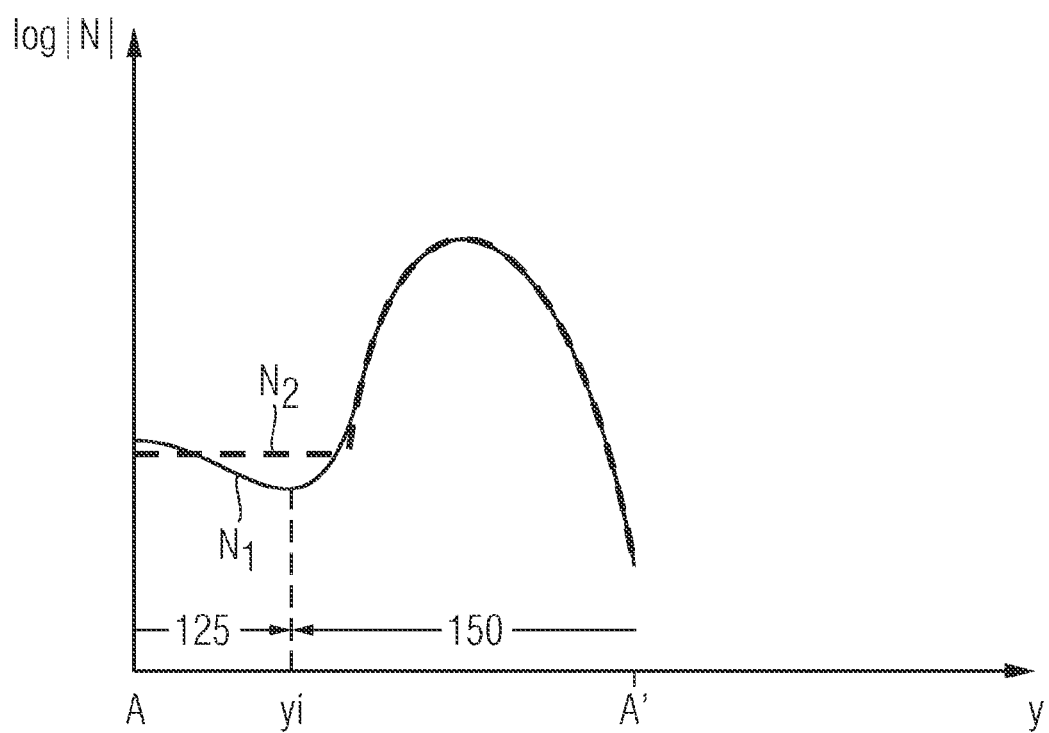
FIG. 2 is a diagram illustrating dopant profiles along the vertical direction of line A-A' of the SiC trench semiconductor device illustrated in FIG. 1.

FIG. 2 is a diagram illustrating dopant profiles $N_1$, $N_2$ of the p-type body zone 125 and the p-type extension zone 150 along the vertical direction y of line A-A' of the trench MOSFET 100 illustrated in FIG. 1 according to embodiments of the invention.

The curve denoted by $N_1$ refers to a sum of dopant concentrations of the p-type body zone 125 and the p-type extension zone 150 in case both zones 125 and 150 are formed by ion implantation. Coordinate $y_i$ refers to an interface between the p-type body zone 125 and the p-type extension zone 150. The profile of dopants of the p-type extension zone 150 is a retrograde profile meaning that a peak, i.e. a maximum concentration of dopants, is neither located at or close to the bottom side adjoining to the n-type drift zone 130, i.e. at or close to A', nor to the top side of the p-type extension zone at $y_i$, i.e. at the interface between the p-type extension zone 150 and the p-type body zone 125. The retrograde profile of dopants of the p-type extension zone 150 may be achieved by selecting appropriate implant parameters such as implant dose and implant energy. Apart from retrograde profiles, the p-type extension zone 150 may also include different types of profiles.

Similar to the profile of dopants denoted by $N_1$, the profile of dopants denoted by $N_2$ also includes the retrograde profile within the p-type extension zone 150. Different from the profile denoted by $N_1$, profile $N_2$ includes a constant or nearly constant concentration of dopants within the p-type body zone 125. The p-type body zone 125 including profile $N_2$ may be formed by in-situ doping during epitaxial growth of this zone, for example. Apart from retrograde profiles, the p-type body zone 125 may also include different types of profiles.

Figure 3:
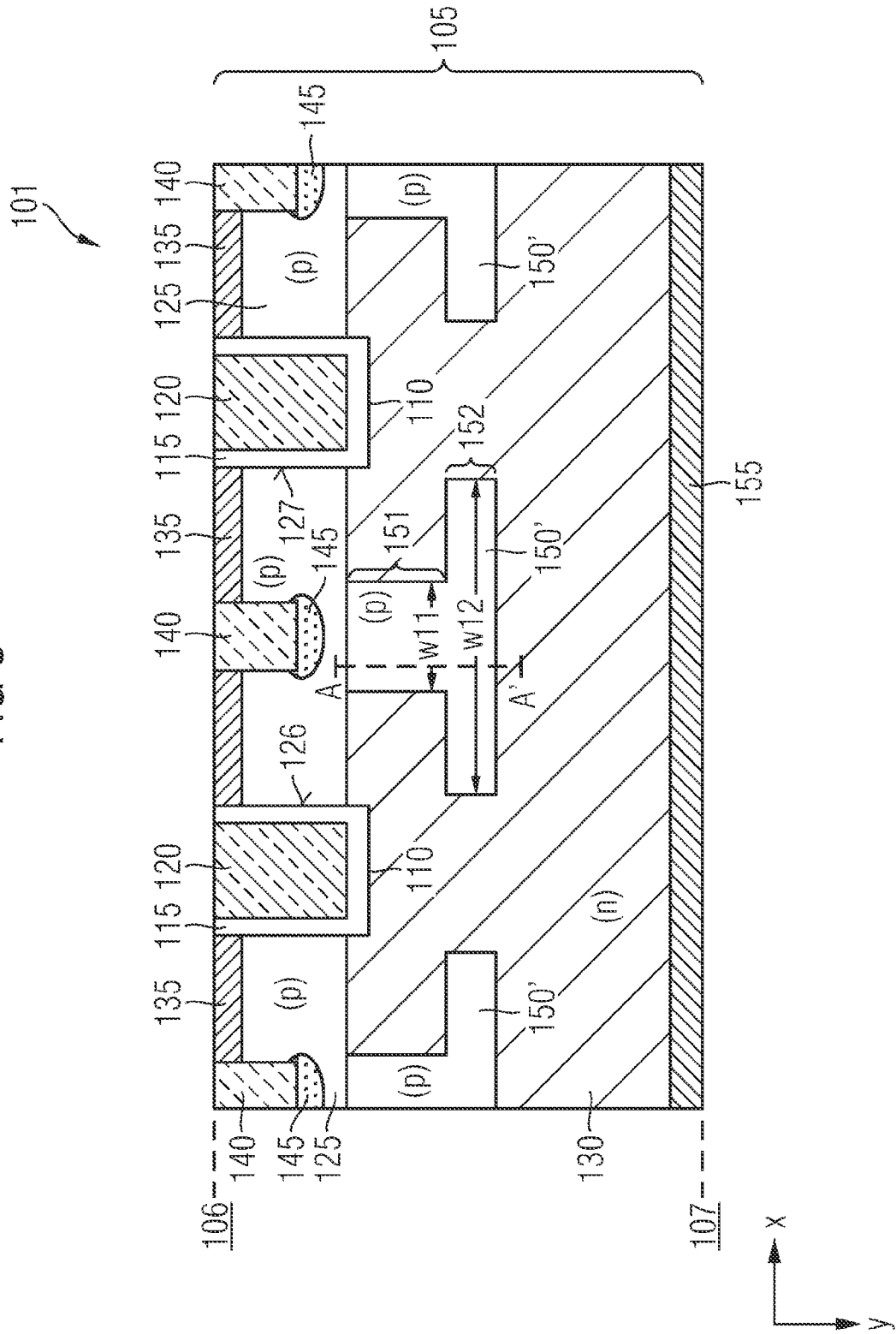
FIG. 3 illustrates a cross-sectional view of a portion of a SiC trench semiconductor device including an upper part of an extension zone having a smaller width than a lower part of the extension zone according to the another embodiment.

FIG. 3 illustrates a portion of a SiC trench MOSFET 101 according to another embodiment.

Trench MOSFET 101 is similar to trench MOSFET 100 illustrated in FIG. 1 except for the design of the p-type extension zone denoted by 150' in FIG. 3.

The p-type extension zone 150' includes an upper part 151 and a lower part 152. A lateral width $w_{11}$ of the upper part 151 is smaller than the lateral width $w_{12}$ of the lower part 152. According to an embodiment, a maximum concentration of dopants within the lower part 152 is higher than the maximum concentration of dopants within the upper part 151.

While a reduced width in the upper part 151 of p-type extension zone 150 allows to counteract a constriction of the current in an entry region of the drift zone 130 when the current exits the channel and enters the entry region of the drift zone 130, the lower part 152 allows to shield the dielectric structure 115 from high electric fields via the space charge region between the n-type drift zone 130 and the p-type extension zone 150' during a blocking operation mode of trench MOSFET 101.

Figure 4:
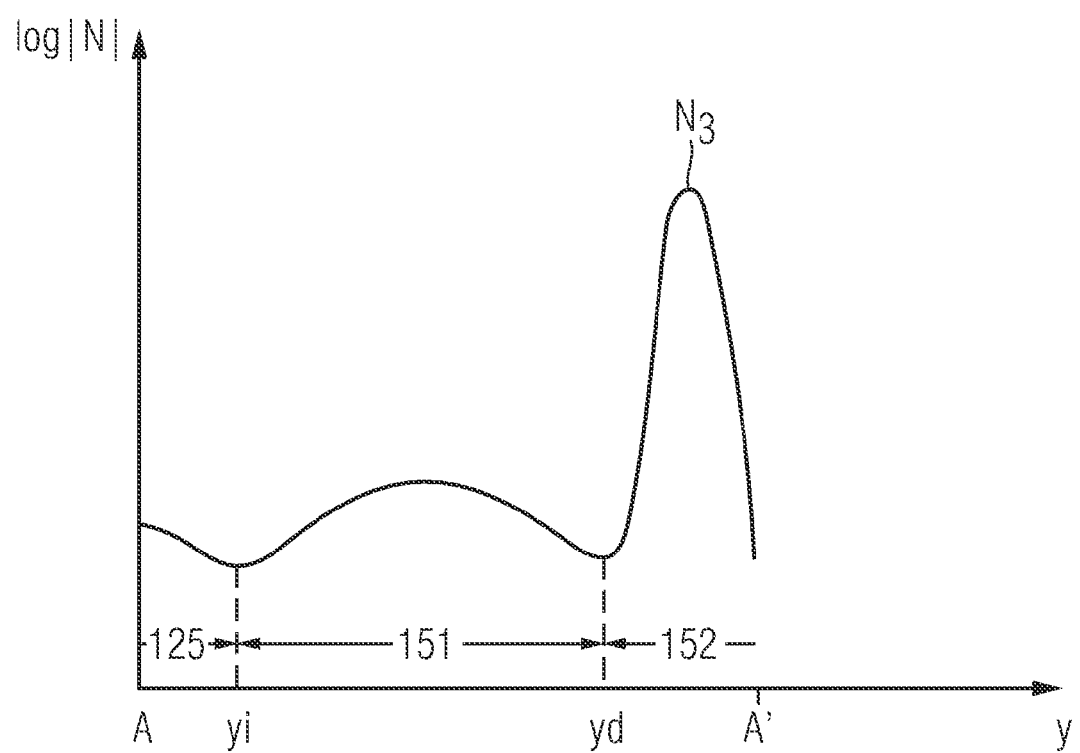
FIG. 4 is a diagram illustrating a dopant profile along the vertical direction of line A-A' of the SiC trench semiconductor device illustrated in FIG. 3 according to an embodiment.

FIG. 4 is a diagram illustrating a dopant profile $N_3$ of the p-type body zone 125 and the p-type extension zone 150' along the vertical direction y of line A-A' of the trench MOSFET 101 illustrated in FIG. 3 according to an embodiment of the invention.

The curve denoted by $N_3$ refers to a sum of dopant concentrations of the p-type body zone 125 and the p-type extension zone 150' in case both zones 125 and 150' are formed by ion implantation. Coordinate $y_i$ refers to an interface between the p-type body zone 125 and the upper part 151 of the p-type extension zone 150'. The profile of dopants in both parts of the p-type extension zone 150', i.e. the upper part 151 and the lower part 152, is a retrograde profile. A peak height of the profile $N_3$ in the lower part 152 is higher than the peak height of $N_3$ in the upper part 151. A retrograde profile of dopants of the upper part 151 and the lower part 152 may be achieved by selecting appropriate implant parameters such as implant dose and implant energy.

Although the retrograde profile of p-type extension zone 150' including the highest peak in the lower part 152 allows to shift electrical breakdown in avalanche into the depth of the semiconductor body, different implant profiles, i.e., non-retrograde profiles may be used.

Figure 5:
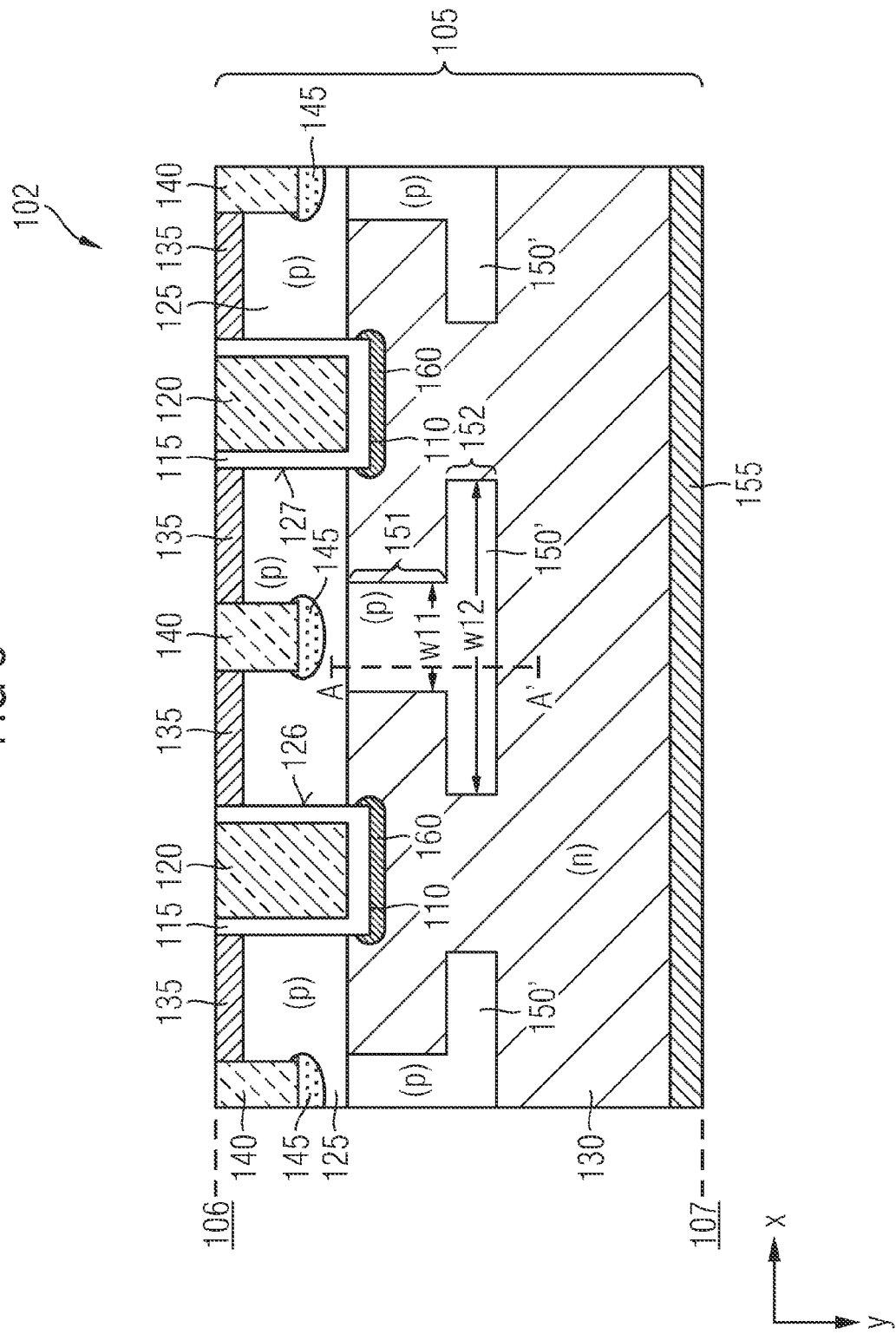
FIG. 5 illustrates a cross-sectional view of a portion of a SiC trench semiconductor device including an extension zone and a current spreading zone at a bottom side of the trench according to yet another embodiment.

FIG. 5 illustrates a cross-sectional view of a portion of a SiC trench MOSFET 102 according to yet another embodiment. The trench MOSFET 102 is similar to the trench MOSFET 101 illustrated in FIG. 3 but, in addition, includes an n-type current spreading zone 160 adjoining to the bottom side of the trench 110. A maximum dopant concentration within the n-type current spreading zone 160 is higher than the maximum dopant concentration of the n-type drift zone 130. As an example, the current spreading zone 160 may be formed by ion implantation using a dose of dopants between $3 \times 10^{12}$ cm$^{-2}$ and $8 \times 10^{12}$ cm$^{-2}$.

Formation of the current spreading zone 160 allows to improve the on-resistance of the trench MOSFET 102 by spreading current entering the drift zone 130 from the channel at the channel end located at the bottom side of the trench 110.

Figure 6:
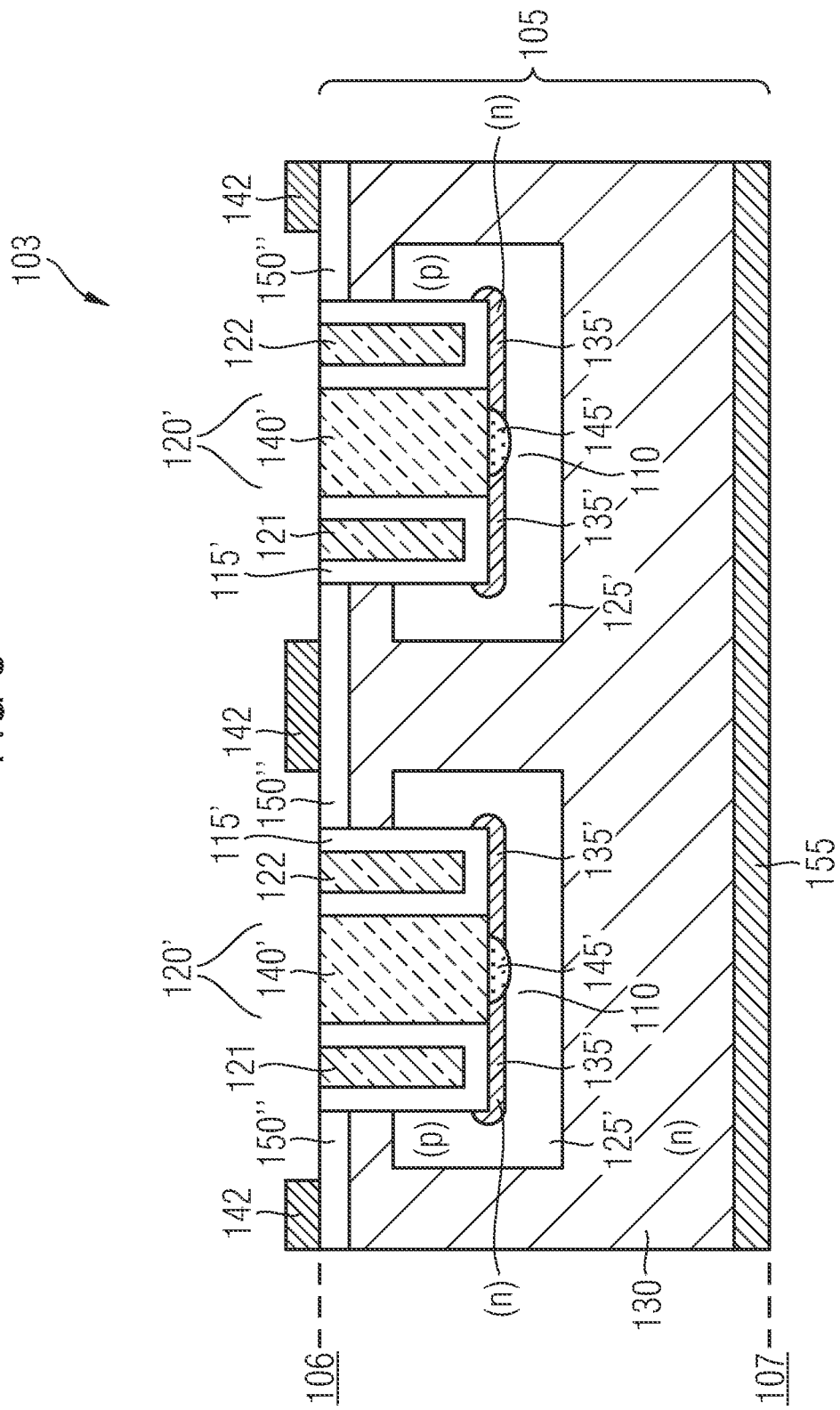
FIG. 6 illustrates a cross-sectional view of a portion of a SiC trench semiconductor device including a body zone and a source zone adjoining to a lower part of the trench and an extension zone formed at a front surface according to an embodiment.

FIG. 6 illustrates a portion of a SiC trench MOSFET 103 according to yet another embodiment.

Similar to trench MOSFET 100 illustrated in FIG. 1, trench MOSFET 103 includes a SiC semiconductor body 105, at least one trench 110 extending into the semiconductor body 105 from a first surface 106 of the semiconductor body 105 as well as a drain zone 155 at a second surface 107 opposing the first surface 106.

Different from trench MOSFETs 100, 101 and 102 illustrated in FIGS. 1, 3 and 5, trench MOSFET 103 includes a p-type body zone 125' adjoining to a bottom side and to a part of the sidewalls of the trench 110. A channel region of the trench MOSFET 103 is located at that part of the sidewall where the p-type body zone 125' adjoins to the trench 110. The p-type body zone 125' is electrically coupled to a contact 140' in the trench 110 via a p-type contact zone 145' adjoining to the bottom side of contact 140'. A source zone 135' adjoins to the bottom side of the trench 110 and a part of a top side of the source zone 135' is in contact with the bottom side of the contact 140' and is, thus, electrically coupled to the contact 140'.

The contact 140' within the trench 110 is electrically insulated from a first part 121 of a gate electrode 120' and a second part 122 of a gate electrode 120' by a dielectric structure 115'. The part of the dielectric structure 115' adjoining to the p-type body zone 125' at the sidewalls of the trench 110 functions as a gate dielectric of trench MOSFET 103.

A p-type extension zone 150" is formed at the first surface, e.g. by implanting ions through the first surface 106. A maximum concentration of dopants within the p-type extension zone is higher than the maximum concentration of dopants within the p-type body zone 125'. With regard to this relation, the dopants defining the p-type contact zone 145' are not considered as dopants of p-type body zone 125'. As an example, a dose of the p-type extension zone may range between $1 \times 10^{13}$ cm$^{-2}$ to $5 \times 10^{14}$ cm$^{-2}$. The p-type extension zone 150" is electrically coupled to a contact 142 on its top side and it may be shorted with the p-type body zone 125', for example.

Between a bottom side of the p-type extension zone 150" and a top side of the p-type body zone 125' a part of the n-type drift zone 130 is arranged. In this part of the drift zone, a current flowing along the vertical channel in a direction from the source zone 135' to the first surface 106 is redirected into a current flowing into an opposite vertical direction through the drift zone 130 to the drain zone 155 at the second surface 107.

In the trench MOSFET 103 high electric fields in a blocking operation mode may be shielded from the dielectric structure 115' by the p-type body zone 125' at the bottom of the trench 110 and by the extension zone 150" at the first side 106. Trench MOSFET 103 allows for an improved reliability of the gate dielectric.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

In the illustrated embodiments above semiconductor regions are denoted by n-type or p-type. According to other embodiments, the conductivity type of these regions may be vice versa.

As used herein, the term "electrically coupled" is not meant to mean that the elements must be directly coupled together but intervening elements may be provided between the "electrically coupled" elements.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    a silicon carbide semiconductor body;
    a trench extending into the silicon carbide semiconductor body at a first surface;
    a gate dielectric and a gate electrode within the trench;
    a body zone of a first conductivity type adjoining to a sidewall of the trench, the body zone being electrically coupled to a contact via a body contact zone including a higher maximum concentration of dopants than the body zone;
    an extension zone of the first conductivity type electrically coupled to the contact via the body zone, wherein a maximum concentration of dopants of the extension zone along a vertical direction perpendicular to the first surface is higher than the maximum concentration of dopants of the body zone along the vertical direction; and wherein
    a distance between the first surface and a bottom side of the extension zone is larger than the distance between the first surface and the bottom side of the trench.

2. The semiconductor device of claim 1, wherein a width of an upper part of the extension zone along a lateral direction perpendicular to the sidewall of the trench is smaller than the width of the body zone.

3. The semiconductor device of claim 2, wherein a shortest lateral distance between the sidewall of the trench and the upper part of the extension zone is within a range between 0 µm and 1 µm.

4. The semiconductor device of claim 3, wherein the width of the upper part of the extension zone is smaller than the width of a lower part of the extension zone.

5. The semiconductor device of claim 1, wherein a profile of dopants of the extension zone along the vertical direction is a retrograde profile.

6. The semiconductor device of claim 5, wherein a peak of the profile of dopants of the extension zone along the vertical direction is within a lower half of the extension zone that is arranged deeper within the semiconductor body than an upper half of the extension zone.

7. The semiconductor device of claim 1, wherein the extension zone includes a dose of dopants between $10^{13}$ cm$^{-2}$ and $5 \times 10^{14}$ cm$^{-2}$.

8. The semiconductor device of claim 1, wherein
    a vertical distance of a bottom side of the extension zone to the bottom side of the trench is between 500 nm to 1 000 nm; and
    a width of the trench along the lateral direction is between 1 µm to 2 µm.

9. The semiconductor device of claim 1, wherein a bottom side and a lateral side of the extension zone adjoin to a drift zone of a second conductivity type different from the first conductivity type.

10. The semiconductor device of claim 9, further comprising:
    a current spreading zone of the second conductivity type adjoining to a bottom side of the trench, the current spreading zone including a maximum concentration of dopants higher than the maximum concentration of dopants within the drift zone.

11. The semiconductor device of claim 10, wherein the current spreading zone includes a dose of dopants between $3 \times 10^{12}$ cm$^{-2}$ and $8 \times 10^{12}$ cm$^{-2}$.

12. The semiconductor device of claim 1, wherein the semiconductor device is a Trench Metal Oxide Semiconductor Field Effect Transistor.

13. A semiconductor device, comprising:
    a silicon carbide semiconductor body;
    a trench extending into the silicon carbide semiconductor body at a first surface;
    a gate dielectric, a gate electrode and a conductive zone within the trench, the conductive zone being electrically insulated from the gate electrode;
    a body zone of a first conductivity type adjoining to a bottom side and to a part of a sidewall of the trench, the body zone being electrically coupled to the conductive zone via a bottom side of the trench;
    a source zone of a second conductivity type adjoining to the bottom side of the trench, the source zone being electrically coupled to the conductive zone via the bottom side of the trench;
    an extension zone of the first conductivity type at the first surface; and
    a drift zone of the second conductivity type, wherein a part of the drift zone is arranged to separate the extension zone and the body zone and adjoins to the sidewall of the trench.

14. The semiconductor device of claim 13, wherein the extension zone is electrically coupled to a contact on a top side of the extension zone.

15. The semiconductor device of claim 14, further comprising:
    a short-circuit between the body zone and the extension zone.

16. The semiconductor device of claim 13, wherein the gate electrode includes a first gate electrode part configured to control a conductivity of a channel region adjoining to a first sidewall of the trench, and a second gate electrode part configured to control the conductivity of a channel region adjoining to a second sidewall of the trench opposed to the first sidewall.

17. The semiconductor device of claim 13, wherein a lateral dimension of the body zone between a side face of the body zone and the sidewall of the trench is between 0.2 µm to 1 µm.

18. The semiconductor device of claim 13, wherein the extension zone includes a dose of dopants between $10^{13}$ cm$^{-2}$ and $5 \times 10^{14}$ cm$^{-2}$.

19. The semiconductor device of claim 13, wherein a maximum concentration of dopants of the extension zone along a vertical direction perpendicular to the first surface is higher than the maximum concentration of dopants of the body zone along the vertical direction.

20. The semiconductor device of claim 13, wherein the semiconductor device is a Trench Metal Oxide Semiconductor Field Effect Transistor.

21. An integrated circuit comprising the semiconductor device of claim 1.

22. An integrated circuit comprising the semiconductor device of claim 13.

* * * * *

UNITED STATES PATENT AND TRADEMARK OFFICE
CERTIFICATE OF CORRECTION

PATENT NO. : 8,525,254 B2
APPLICATION NO. : 12/854974
DATED : September 3, 2013
INVENTOR(S) : M. Treu et al.

Page 1 of 1

It is certified that error appears in the above-identified patent and that said Letters Patent is hereby corrected as shown below:

Title Page, Item (73) Assignee, please change "Villach (AU)" to --Villach (AT)--.

Signed and Sealed this
Twenty-fifth Day of February, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,525,254 B2  Page 1 of 1
APPLICATION NO. : 12/854974
DATED : September 3, 2013
INVENTOR(S) : M. Treu et al.

It is certified that error appears in the above-identified patent and that said Letters Patent is hereby corrected as shown below:

On the Title Page, Item (54), and in the Specification, Column 1, Line 1, Title, please change "SILICONE" to --SILICON--.

Signed and Sealed this
Twenty-seventh Day of May, 2014

Michelle K. Lee
*Deputy Director of the United States Patent and Trademark Office*